US007620866B2

(12) United States Patent  
Marinissen et al.

(10) Patent No.: US 7,620,866 B2  
(45) Date of Patent: Nov. 17, 2009

(54) TEST ACCESS ARCHITECTURE AND METHOD OF TESTING A MODULE IN AN ELECTRONIC CIRCUIT

(75) Inventors: Erik J. Marinissen, Eindhoven (NL); Thomas F. Waayers, Sint Michielsgestel (NL)

(73) Assignee: NXP B.V., Eindhoven (NL)

( * ) Notice: Subject to any disclaimer, the term of this patent is extended or adjusted under 35 U.S.C. 154(b) by 235 days.

(21) Appl. No.: 10/586,218

(22) PCT Filed: Jan. 13, 2005

(86) PCT No.: PCT/IB2005/050153

§ 371 (c)(1),
(2), (4) Date: Jul. 14, 2006

(87) PCT Pub. No.: WO2005/071425

PCT Pub. Date: Aug. 4, 2005

(65) Prior Publication Data

US 2007/0208970 A1   Sep. 6, 2007

(30) Foreign Application Priority Data

Jan. 19, 2004   (EP)   .................................. 04100141

(51) Int. Cl.
*G01R 31/28* (2006.01)
(52) U.S. Cl. .................................................... 714/727
(58) Field of Classification Search .................. 714/724, 714/726, 727
See application file for complete search history.

(56) References Cited

U.S. PATENT DOCUMENTS

| | | | |
|---|---|---|---|
| 6,378,090 B1 * | 4/2002 | Bhattacharya | 714/724 |
| 6,886,110 B2 * | 4/2005 | O'Brien | 714/34 |
| 7,103,814 B2 * | 9/2006 | Corbin et al. | 714/726 |
| 7,181,663 B2 * | 2/2007 | Hildebrant | 714/726 |
| 7,231,563 B2 * | 6/2007 | Vinke et al. | 714/718 |
| 7,296,200 B2 * | 11/2007 | Park et al. | 714/724 |

OTHER PUBLICATIONS

Waayers T Ed—Institute of Electrical and Electronics Engineers: "An Improved Test Control Architecture and Test Control Expansion for Core-Based System Chips"; Proceedings International Test Conference 2003. (ITC); Charlotte NC. Sep. 30, Oct. 2, 2003; International Test Conf. N.Y.: IEEE US vol. 1, Sep. 30, 2003; pp. 1145-1154.
Zorian Y et al: "Testing Embedded-Core Based System Chips"; Proceedings International Test Conference 1998 (IEEE Cat. No. 98CH36270) Int. Test Conf. Washington DC USA; Online Oct. 23, 1999 pp. 130-143.

* cited by examiner

*Primary Examiner*—James C Kerveros

(57) ABSTRACT

According to an example embodiment of the present invention, there is a test access architecture for testing modules in an electronic circuit. The test access architecture includes a test access mechanism (TAM) having a plurality of modules connected in series thereto; the test access mechanism is arranged to transport test stimulus data to, and test response data from a module being tested. A global enable signal is provided for placing the modules in a test mode. A control circuit is provided between the global enable signal and an associated module; wherein the control circuit is arranged to control whether or not the global enable signal is passed to its associated module.

25 Claims, 15 Drawing Sheets

TEST ACCESS ARCHITECTURE AND METHOD OF TESTING A MODULE IN AN ELECTRONIC CIRCUIT

The present invention relates to a test access architecture and method for testing an electronic circuit, and in particular to a test access architecture and method for modular testing a system on chip (SOC).

Modern semiconductor design methods and manufacturing technologies enable the creation of a complete system on one single die, the so-called "system chip" or SOC. Such system chips are typically very large integrated circuits, consisting of millions of transistors, and containing a variety of hardware modules. In order to design these large and complex system chips in a timely manner and leverage from external design expertise, reusable cores are increasingly being used. Cores are pre-designed and pre-verified design modules that are intended for re-use in multiple SOC designs. Examples of cores are CPUs, DSPs, media co-processors, communication modules, memories, and mixed-signal modules.

Due to imperfections in their manufacturing process, all integrated circuits need to be individually tested for manufacturing defects. System chips are no exception to that rule. Modular test development is increasingly used for SOCs. Non-logic modules, such as embedded analog circuitry and memories require stand-alone testing due to their "abnormal" circuit structure. Black-boxed third-party cores, such as hard (layout) cores and encrypted cores, for which no implementation details are known, need to be tested by the tests supplied by their provider, and therefore also require stand-alone testing. Furthermore, even for logic modules of which the implementation details are known, modular test development is an attractive alternative. Here, a modular "divide-and-conquer" test development approach helps to reduce the test generation compute time and associated data volume. Finally, a modular test approach enable test reuse, which is especially beneficial if a core or module is used in multiple SOC designs.

In order to enable modular test development, an embedded module should be isolated from its surrounding circuitry and electrical test access needs to be provided. A paper by Zorian et al, Proceedings of the IEEE International Test Conference (ITC), pages 130-143, Washington D.C., October 1998, describes a generic conceptual test access architecture enabling modular testing of SOCs. The test access architecture consists of three main elements per module under test. These comprise (1) a test pattern source and sink, (2) a test access mechanism (TAM), and (3) a wrapper. The wrapper can isolate the module from its surroundings and provides switching functionality between functional access to the module and test access through the TAM. A SOC test access architecture determines the number of distinct TAMs and their widths, the assignment of modules to TAMs, and the design of the test wrappers.

The design of a test access architecture is typically constrained by the total amount of TAM wires "w" and the number of modules "m" to be tested. The number of TAM wires w is dictated, for example, by the number of available IC pins, the amount of TAM wiring area the SOC designer wishes to spend, or by other practical constraints. Given w and the number of modules m to be tested, the SOC designer has to determine the number of separate TAMs and their individual widths $w_i$ (such that $\Sigma w_i \leq w$) and the assignment of modules to TAMs (such that every module is connected to exactly one TAM).

One possibility is to create a separate TAM for each module. This only works if the number of modules m is less than or equal to the number of TAM wires w. This type of test access architecture is referred to as a "Distribution" architecture. The challenge of designing a Distribution architecture is to optimize the individual TAM widths $w_i$ such that the overall test time is minimized. Another possibility is to create one single TAM of width w, to which all modules are connected. Such a test access architecture is referred to as a "Daisychain" architecture.

The Distribution and Daisychain architectures form two extremes of an entire spectrum of architectures, which are referred to as "Hybrid TAM Architectures". These architectures consist of a number of separate TAMs, while every TAM services the test access needs of a number of modules.

FIG. 1 shows a typical hybrid TAM Architecture for a SOC. The SOC contains twenty eight modules 3 that need to be tested individually (ie m=28). This test access architecture 1 consists of nine distinct TAMs $5_1$ to $5_9$. In the example, the TAMs $5_1$ to $5_9$ have the following respective widths: 23, 6, 4, 3, 5, 10, 6, 6, 1. This gives a total TAM width w of 64 wires. The module assignment vector for this architecture is ($5_6$; $5_8$; $5_4$; $5_3$; $5_2$; $5_6$; $5_4$; $5_7$; $5_3$; $5_9$; $5_6$; $5_5$; $5_9$; $5_9$; $5_9$; $5_9$; $5_3$; $5_2$; $5_3$; $5_3$; $5_7$; $5_9$; $5_9$; $5_9$; $5_5$; $5_1$; $5_9$; $5_9$). In other words, the first of the modules 3 is assigned to TAM $5_6$, the second module to TAM $5_8$, the third module TAM $5_4$, and so on for the twenty eight modules.

FIG. 1 therefore shows the widths of the individual TAMs $5_1$ to $5_9$, and the assignment of the various modules 3 to the TAMs $5_1$ to $5_9$. The design of the test access architecture has a large impact both on the required vector memory depth per tester channel, as well as on the test application time of the SOC, two key parameters in the overall SOC test cost.

While the two extremes of the spectrum, i.e., Distribution and Daisychain architectures have proved popular with SOC design teams that do not have access to automated test access architecture design tools, research has shown that in virtually all cases, these two architectures result is significantly longer test times than the Hybrid TAM Architectures.

From the above, it can be concluded that, in many situations, in order to minimize the required tester vector memory and test application time, it is desirable to design a test access architecture in which multiple modules are connected to a common TAM, for example as shown in TAMs $5_2$, $5_3$, $5_4$, $5_5$, $5_6$, $5_7$, and $5_9$.

When multiple modules 3 are connected to a common TAM 5 in this manner, it must be ensured that the test data of each module 3 in that TAM 5 can reach the SOC pins. Therefore, each module 3 needs to have a "transparent mode", in which test pattern data of another module can be transported along this module. It is noted that transporting the test pattern data involves the transportation of test stimulus data to the module being tested, and the transportation of test response data from the module being tested. Two known examples for providing this "transparent mode" are shown in FIGS. 2A and 2B. The transparent test access path in both figures is indicated by means of the bold lines.

In FIG. 2A, a test access method hereinafter referred to as "through module" is illustrated. The module 3 is shown with a test wrapper 7, which receives a number of test signals, including a global scan enable signal 27 (se). The global scan enable signal 27 is provided for placing the module in scan test mode. According to this arrangement, TAM inputs 21 and TAM outputs 23 form connected scan chains, with wrapper input cells, module internal scan chains 25, and wrapper output cells as their elements. This makes it possible to scan through all these elements. The benefit of this approach is that it does not require additional hardware, since it simply makes use of the existing wrapper and scan chain infrastructure. The drawback of this approach is that the resulting test times depend on the length of these wrapper scan chains, and hence can be extremely long. In other words, test stimulus data must be shifted into a module under test (possibly though a number of other modules), and then the test response data shifted out to the SOC pins (again possibly through a number of other modules). It will be appreciated that the test response data from one test must be shifted out before the next test stimulus data can be launched and the corresponding test response data captured, otherwise the test response data from the first test will be corrupted by another module.

In FIG. 2B, a test access method hereinafter referred to as "via bypass" is illustrated. As before, the test wrapper 7 receives a plurality of test signals, including a global scan enable signal 27 (se). According to this arrangement, the test access method makes use of dedicated hardware comprising bypass wires 28 and bypass logic 29. At the expense of this additional on-chip hardware, ie necessary for the implementation of the bypass, the time required for transporting test pattern data of other modules along this module is substantially reduced. In other words, when transporting test stimulus data to a particular module under test, the test stimulus data bypass all modules located prior to the module under test, while the test response data from the tested module bypass all modules located after the module under test.

The operation of the arrangements described above will now be explained in relation to FIGS. 3A and 3B, which illustrate schematically how two modules are connected according to the test access architectures of FIGS. 2A and 2B, respectively. It will be appreciated that only two modules have been shown for simplicity, but that the invention is equally applicable to any number of modules being connected in this manner.

In FIG. 3A, module A is connected to module B in the "through module" format. Module A comprises internal scan chains 31 and 33 which receive test stimulus data from the input TAM wires 35. The output 37 of the scan chains 31 and 33 of module A form the input 38 of internal scan chains 39 and 41 of module B. The output 43 of scan chains 39 and 41 are in turn passed to a further module, or to the SOC pins (not shown). A common scan enable signal 27 (se) is connected to each of the modules A and B. Therefore, in operation, when testing module A, test stimulus data is shifted into module A, and the scan enable signal 27 activated. This results in both modules A and B entering the scan test mode together, whereby the test stimulus data in module A is launched, and the test response data captured. Once the test stimulus data has been launched and the test response data captured, the scan enable signal 27 is deactivated, and the test response data from module A must then be shifted out through module B. However, so that the test response data is not corrupted on its path to the output, the scan enable signal 27 cannot be activated again until the test response data has been shifted through module B, otherwise the test response data will be corrupted by module B. This results in the test time being increased, since the next test stimulus data for module A cannot be launched (and the test response data captured) until the test response data from the previous test has been shifted out past module B. In a similar manner to the above, to test module B the test stimulus data for module B needs to be shifted though module A, which also results in an increased test time. The above problems are increased further when more than two modules are connected in series on the same TAM.

In contrast, FIG. 3B shows how two modules A and B are connected in the "bypass" mode. According to this arrangement, the architecture comprises additional bypass hardware comprising multiplexers 47 and 49, and additional bypass wires 51 and 53. In effect, the input wires 35 to module A are also connected to the multiplexer 47. This means that when module B is being tested, the test stimulus data from input wires 35 is passed directly to the input of module B via the wires 51 and multiplexer 47, thereby bypassing module A. Likewise, when module A is being tested, the test response data output on wires 37 from module A can be transported via the multiplexer 47, the bypass wires 53 and multiplexer 49, thereby bypassing module B.

It is noted that, in this arrangement, both modules A and B receive the common scan enable signal 27. However, a dedicated bypass signal 55 is provided for bypassing module A, while a dedicated bypass signal 57 is provided for bypassing module B.

Basically, the two alternatives described above provide a trade-off between (1) low silicon area at the expense of large test time, versus (2) short test time at the expense of additional silicon area. In order to appreciate the benefits and costs of each option, the tradeoff for a typical SOC design having 57 different modules and a total test rail width of 142 wires will be discussed. Implementing bypasses for all wires and all modules would cost 57×142=8094 additional multiplexers and flip flops. In terms of additional flip flops, this adds 3% to the overall flip flop count. From this, it can be concluded that the silicon area costs of adding bypasses to all modules are substantial. On the other hand, not implementing bypasses makes the overall test data volume increase by 12% from 1.52 Mbit/pin to 1.73 Mbit/pin. Hence, the additional test time costs of not implementing bypasses are substantial as well.

In the light of the above, the aim of the present invention is to provide a test access architecture and method that allows the shorter test times of the bypass implementation to be achieved, but at substantially lower silicon area costs.

According to an example embodiment of the present invention, there is a test access architecture for testing modules in an electronic circuit. The test access architecture comprises a test access mechanism (TAM) having a plurality of modules connected in series thereto; the test access mechanism is arranged to transport test stimulus data to, and test response data from a module being tested. A global enable signal is provided for placing the modules in a test mode. A control circuit is provided between the global enable signal and an associated module: wherein the control circuit is arranged to control whether or not the global enable signal is passed to its associated module.

The control circuit is connected to receive the global enable signal and the dedicated bypass signal, and arranged to provide a local enable signal to its associated module based on the respective states of the global enable signal and the dedicated bypass signal.

This has the advantage of allowing the control circuit to pass the global enable signal if its associated module is being tested, and to block the global enable signal if its associated module is not being tested.

Preferably, the control circuit is an OR gate. Alternatively, depending on the control signals being used, the control circuit may be another logic gate, such as an AND gate.

The control circuit is preferably located within a test wrapper of its associated module. Alternatively, the control circuit may be located in a test control block of a system on chip (SOC), or within the module itself.

Preferably, the test stimulus data and test response data is processed in a pipelined manner, thereby enabling the test time to be reduced further.

According an another example embodiment of the present invention, there is a method of testing a module in an electronic circuit. The module is one of a plurality of modules connected in series to a test access mechanism (TAM); the test access mechanism is arranged to transport test stimulus data to a module being tested, and to transport test response data from the module being tested. The method comprises loading a first set of test stimulus data into the module being tested. In response to a global signal being activated, the module is tested. From the module being tested, captured test response data are unloaded. Wherein, during the testing step, other modules connected to the test access mechanism (TAM) are placed in a transport mode of operation, such that the other modules do not corrupt a second set of test stimulus data being loaded into, or previous test response data being unloaded from, the module under test.

For a better understanding of the present invention, and to show more clearly how it may be carried into effect, reference will now be made, by way of example, to the accompanying drawings, in which.

Figure 4:
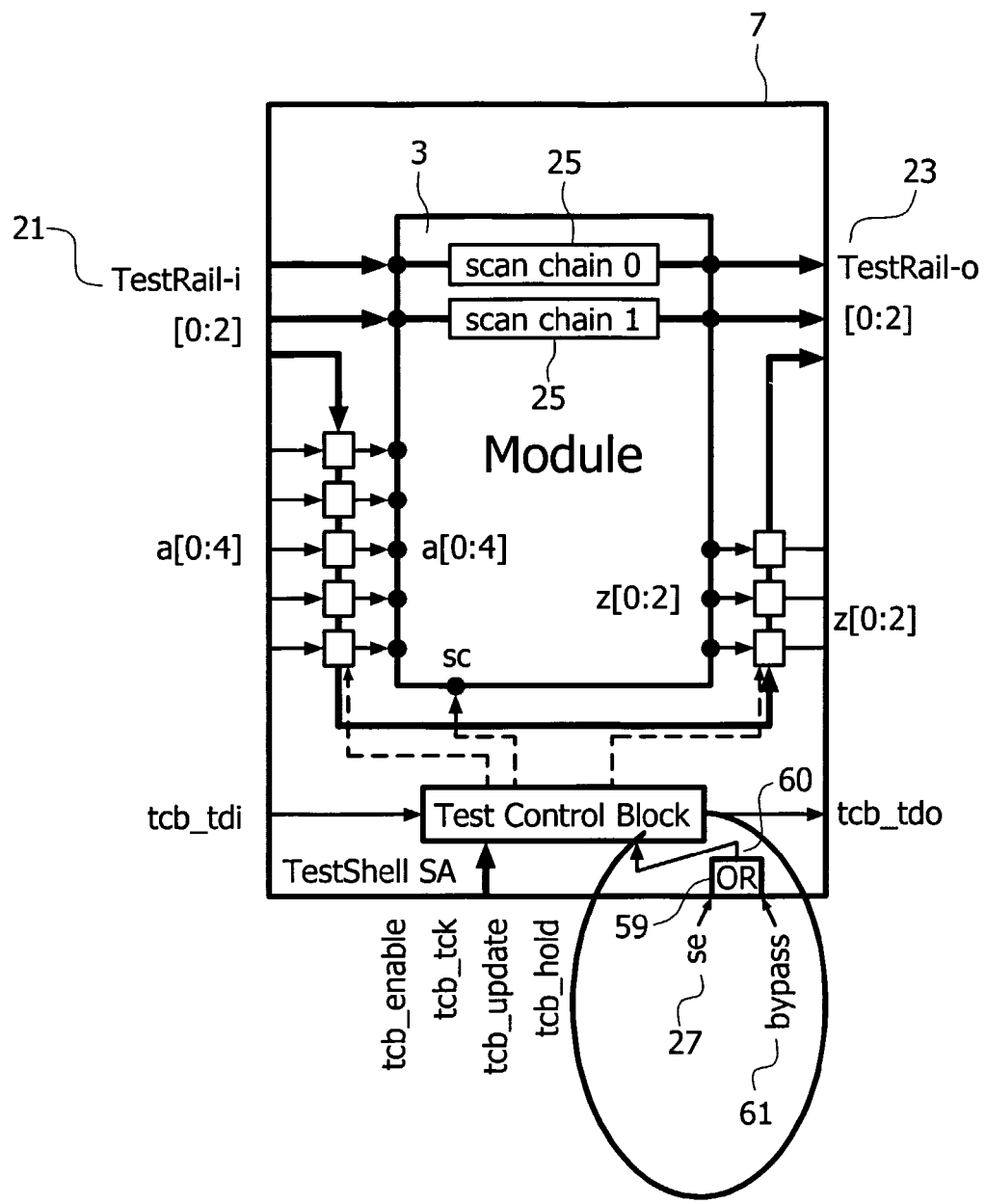
FIG. 4 illustrates a test access architecture according to a preferred embodiment of the present invention.

FIG. 4 shows a test access architecture according to a preferred embodiment of the present invention. In a similar manner to the test access architectures of FIGS. 2A and 2B, the test access architecture comprises a module 3 having internal scan chains 25, and connected to receive test stimulus data on TAM input wires 21 and to output test response data on TAM output wires 23. The module 3 also receives a global scan enable signal 27 (se). It is noted that the global scan enable signal 27 (se) may be a global signal for all modules in the TAM, a group of modules, or even for all modules in the SOC.

According to the invention a control circuit, for example a two input OR gate 59, is provided between the global scan enable signal 27 and the module 3. One input of the OR gate 59 is connected to receive the global scan enable signal 27 (se). The second input of the OR gate 59 is connected to receive a dedicated bypass signal 61. The output of the OR gate 59 provides a local scan enable signal 60, which is connected to wherever the global scan enable 27 (se) used to be connected within the module and its wrapper. Since the dedicated bypass signal 61 is specific to a particular module, this means that each module has a dedicated signal for effectively controlling whether the global scan enable signal 27 is passed to that module. In other words, the dedicated bypass signal 61 acts as a control signal for controlling whether or not the local scan enable signal 60 mirrors the global scan enable signal 27.

Effectively, this implementation enables the global scan enable signal 27 to be kept high for one or more particular modules that are not being tested, by maintaining the dedicated bypass signal 61 high for those particular modules, thereby placing them in a transport mode of operation.

Figure 1:
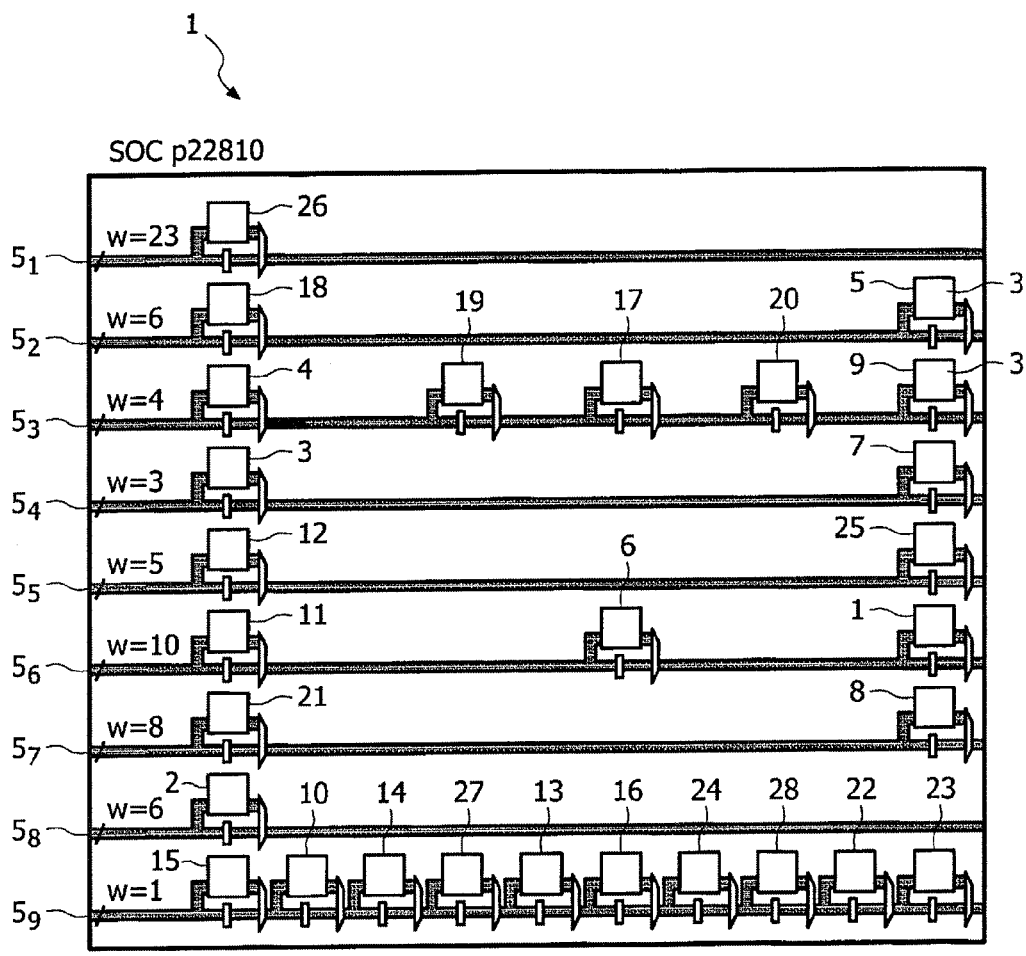
FIG. 1 illustrates a typical test access architecture according to the prior art.
Figure 2A:
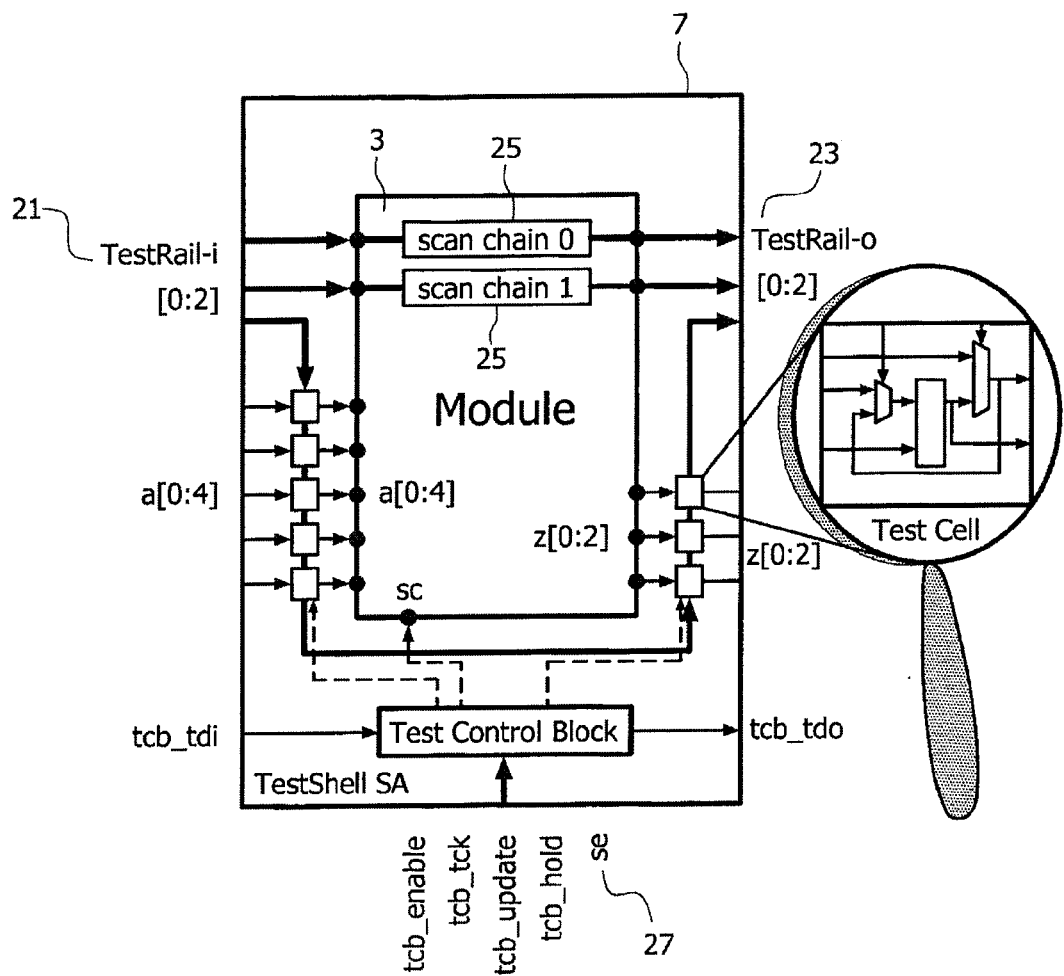
FIG. 2A illustrates a test wrapper for use in the architecture of FIG. 1, using a "through module" arrangement.
Figure 2B:
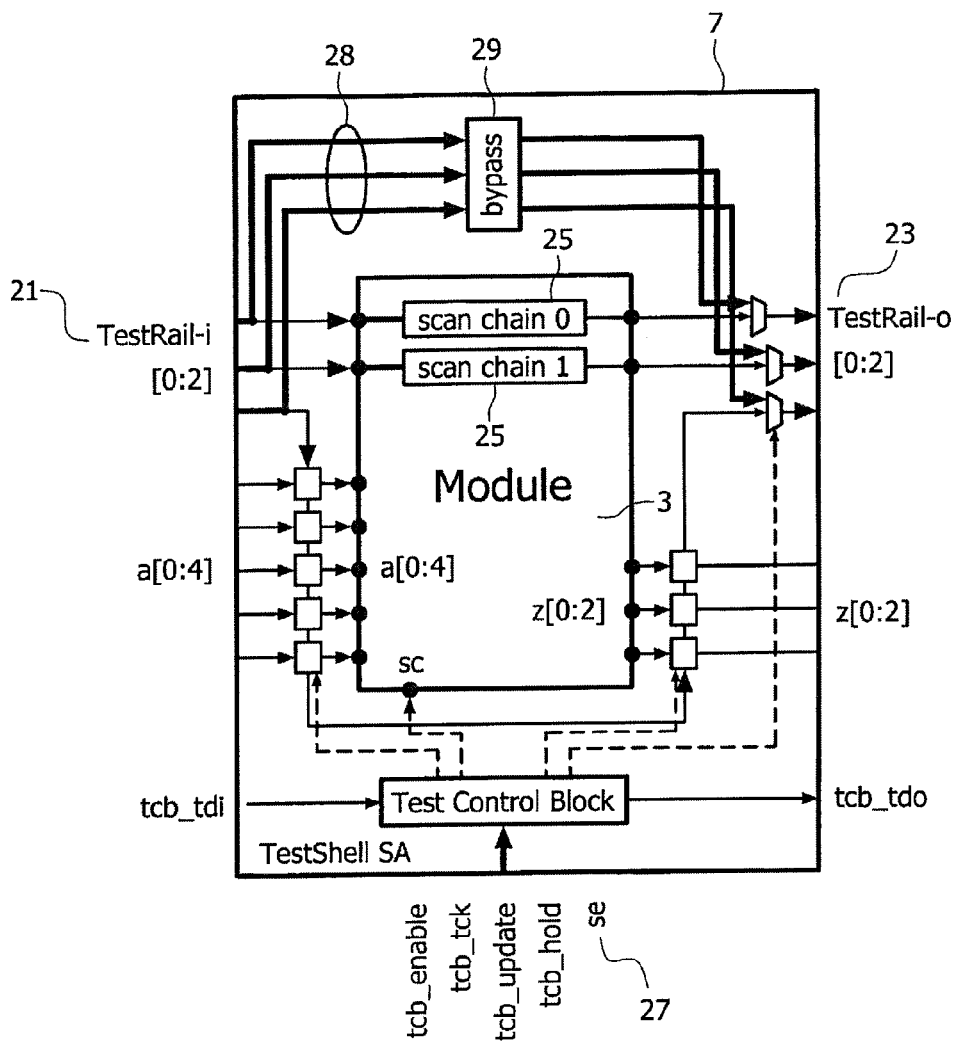
FIG. 2B illustrates a test wrapper for use in the architecture of FIG. 1, using a "via bypass" arrangement.
Figure 3A:
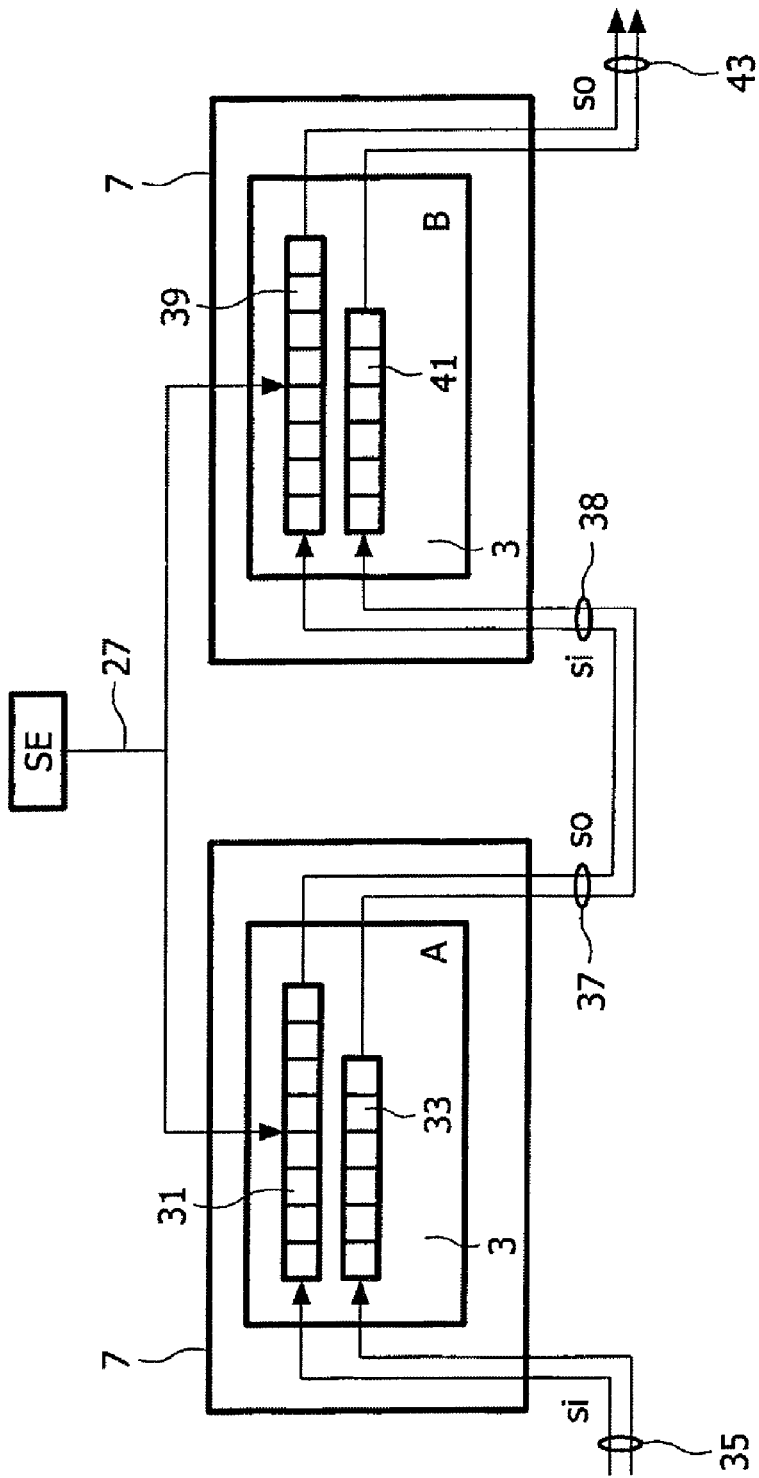
FIG. 3A illustrates schematically how two modules are connected according to the arrangement of FIG. 2A.
Figure 3B:
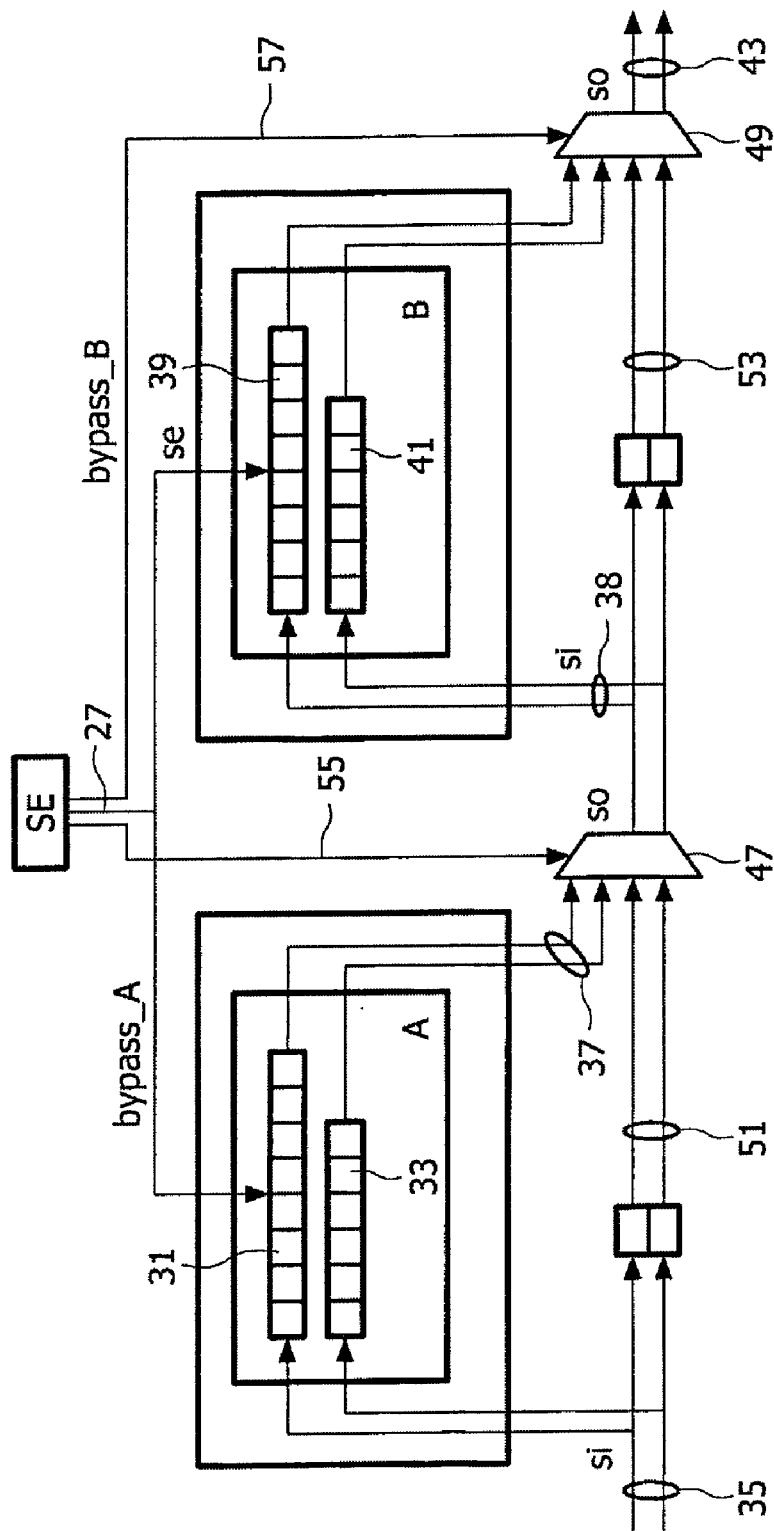
FIG. 3B illustrates schematically how two modules are connected according to the arrangement of FIG. 2B.

The provision of the logic gate 59 enables the test access architecture to be operated as follows. If, in order to test another module, test stimulus data needs to be transported via this module, the data is transported through this module (as shown in FIGS. 2A and 3A). However, in order to avoid having additional test time, the transparent modules are allowed to work in a pipelined mode. This means that modules in front of the module-under-test already contain the subsequent test stimulus data to be applied after the current test stimulus data. At the same time, the modules after the module-under-test still contain test response data from previous tests, which are still on their way out to the SOC pins. Since the global scan enable signal 27 will be activated before the previous test response data has been shifted through to the output, the dedicated bypass signal 61 is kept high to prevent the global scan enable signal 27 from reaching the other modules, ie the local scan enable signal 60 remains high in the other modules.

Thus, the neighboring modules, which are not being currently tested themselves, operate in a transport mode of operation, whereby they serve as transport chains to and from the module-under-test, and function as FIFO buffers for either test stimulus data or test response data.

Figure 5:
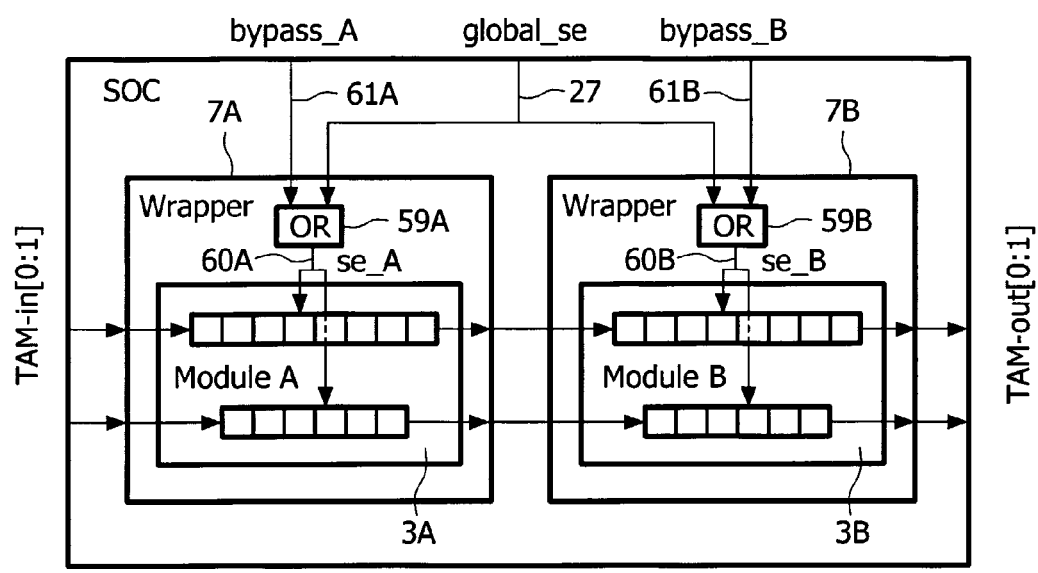
FIG. 5 illustrates a schematic diagram of the test access architecture of FIG. 4, in accordance with the present invention.

FIG. 5 shows a schematic diagram of two modules, modules A and B, connected according to the present invention. Modules A and B each contain two scan chains of lengths eight and six flip flops. For test access, A and B are connected into one common two-bit TAM. Both modules receive a global scan enable signal 27 (se) which, when asserted, makes the corresponding scan chains scan. In accordance with the invention, the global scan enable signal 27 (se) is OR-gated in each module with a dedicated bypass signal 61A, 61B, named bypass_A and bypass_B, respectively.

It is noted that, although the preferred embodiment shows the use of a logic OR gate, it will be readily appreciated by a person skilled in the art that other implementations include those with a logic AND gate (for example, in case of reversed polarities of the global scan enable (se) and bypass signals involved). Furthermore, the gate may be positioned either further away from the local modules (e.g., in a SOC-level Test Control Block (TCB)) or integrated deeper into the local modules (e.g., after a module specific TCB).

As described above in FIG. 4, a plurality of test stimulus data are shifted into the scan chains of module A, and the corresponding test response data shifted out through module B. However, to avoid increasing the test time, the transparent modules are allowed to work in a pipelined mode. This means that modules in front of the module-under-test already contain the subsequent test stimulus data to be applied after the current test stimulus data. At the same time, the modules after the module-under-test still contain test response data from previous tests, which are still on their way out to the SOC pins. In order to avoid data corruption, each module has a control circuit, for example the OR gates 59A and 59B, for controlling whether or not the global scan enable signal 27 is passed as a local scan enable signal 60A and 60B to the modules 3A and 3B, respectively. For each module that is not being tested (and therefore acting in a "transparent" mode) the associated dedicated bypass signal is kept high, which means that the corresponding local scan enable for that module is kept high, thereby preventing the global scan enable signal 27 from corrupting test pattern data being transported through that module.

FIGS. 6a to 6h describe the operation of the invention when applying three sets of test stimulus data to Module A. As described above, the scan testing works according the following procedure:

(1) the first set of test stimulus data is loaded into the scan chains;
(2) the test stimulus data is launched and the test response data captured into the same scan chains;
(3) the test response data is off-loaded from the scan chains, while the next set of test stimulus data is loaded into the scan chains, and so on.

Figure 6A:
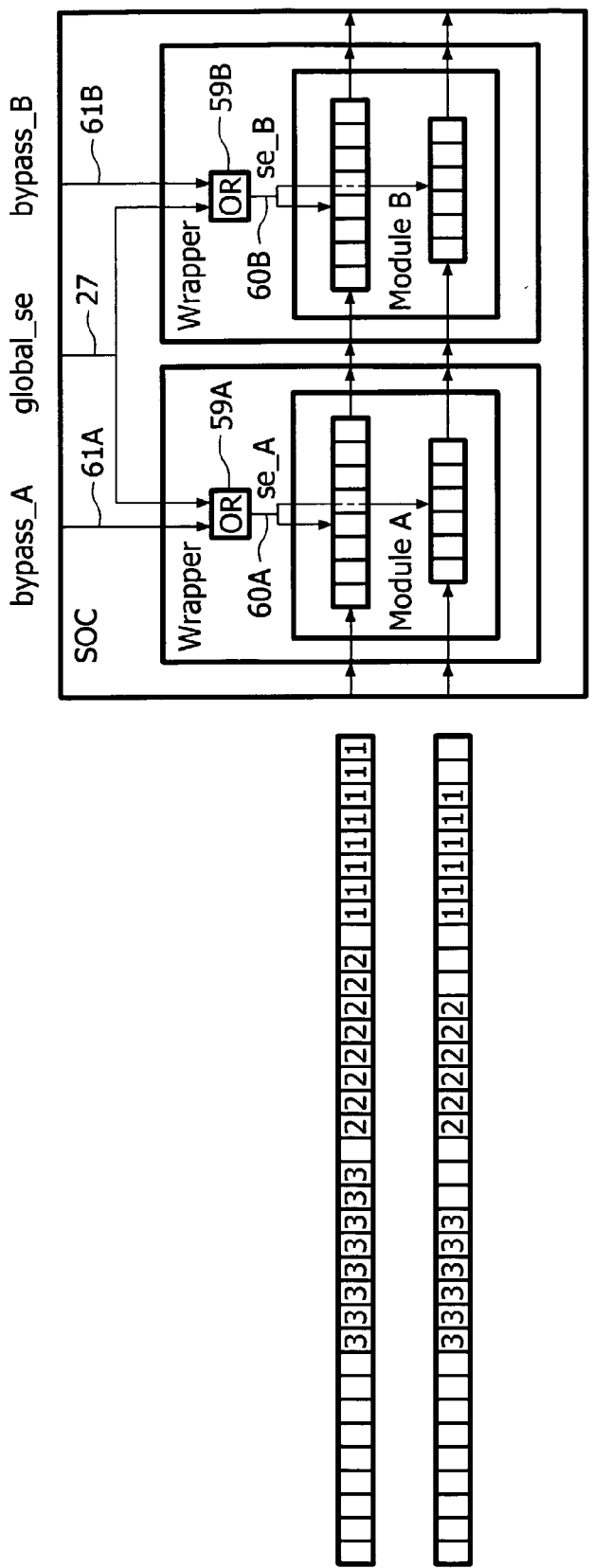
FIGS. 6a to 6h illustrate the method of testing a module using the test access architecture of FIGS. 4 and 5.

At time t=0 as illustrated in FIG. 6a, the circuit is shown prior to commencement of testing. The first bit 62 of the TAM contains three 8-bit test stimulus data in a pipelined configuration, each stage of the pipeline being separated by a single clock 65 as will be described later. The second bit 63 of the TAM contains three 6-bit test stimulus data in a pipelined configuration. The second test stimulus data is arranged such that the $8^{th}$ bit of the 8-bit test stimulus data is adjacent the $6^{th}$ bit of the 6-bit test stimulus data.

Figure 6B:
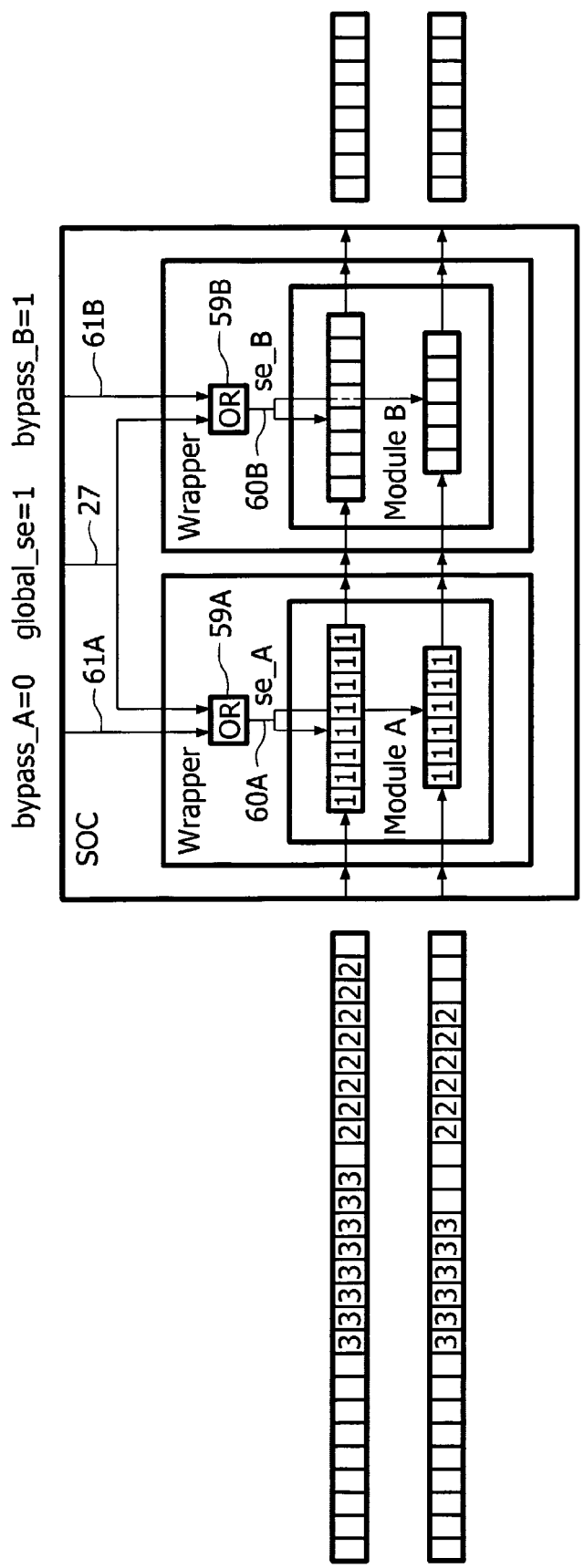

FIG. 6b shows the position of the test pattern data after eight clock cycles, ie t=8. It can be seen that the first set of test stimulus data has been loaded into the scan chains of module A. During loading, the global scan enable signal 27 is high. Also, since module A is being tested the dedicated bypass signal 61A for module A is preferably low, while the dedicated bypass signal 61B for module B is preferably high (ie because module B is not being tested).

Figure 6C:
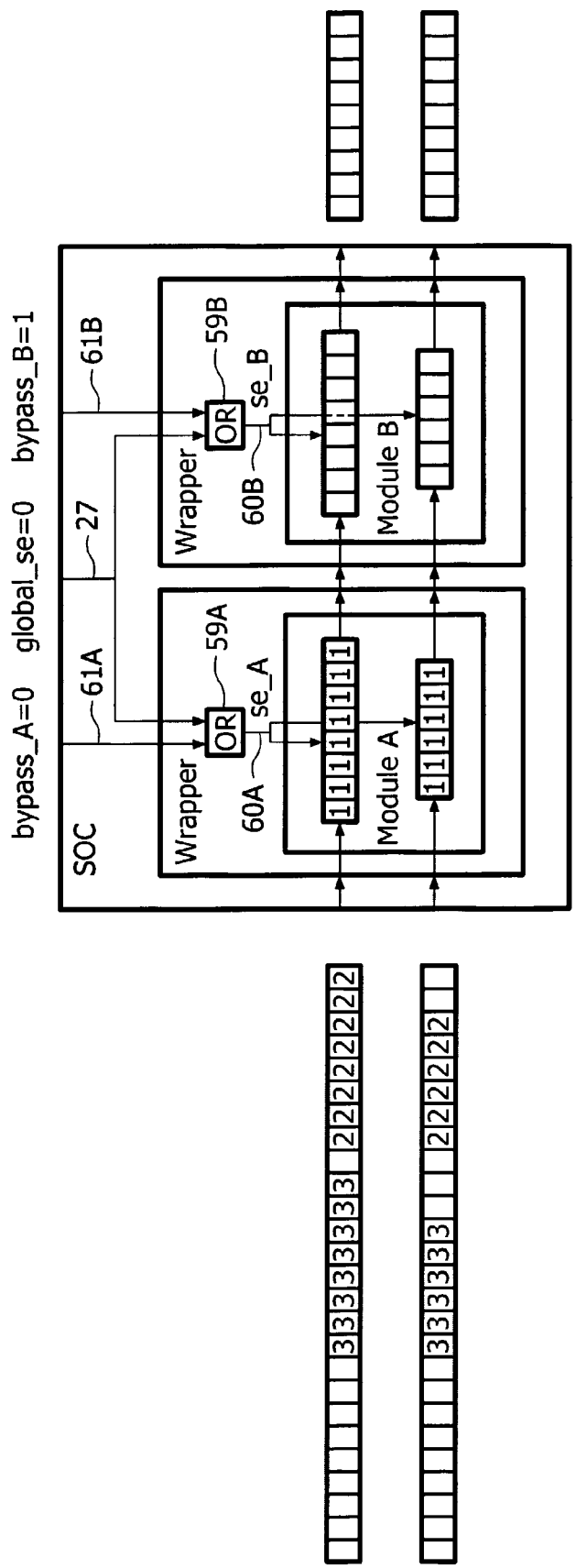

FIG. 6c shows the operation of the circuit at t=9. At this point, the global scan enable signal 27 goes low. Since the dedicated bypass signal 61A is low, the local scan enable signal 60A also goes low, resulting in the first set of test stimulus data being launched into module A, and the corresponding set of test response data being captured in module A.

However, since the dedicated bypass signal 61B is high, the local scan enable signal 60B for module B remains high, and therefore no testing is performed in module B.

Figure 6D:
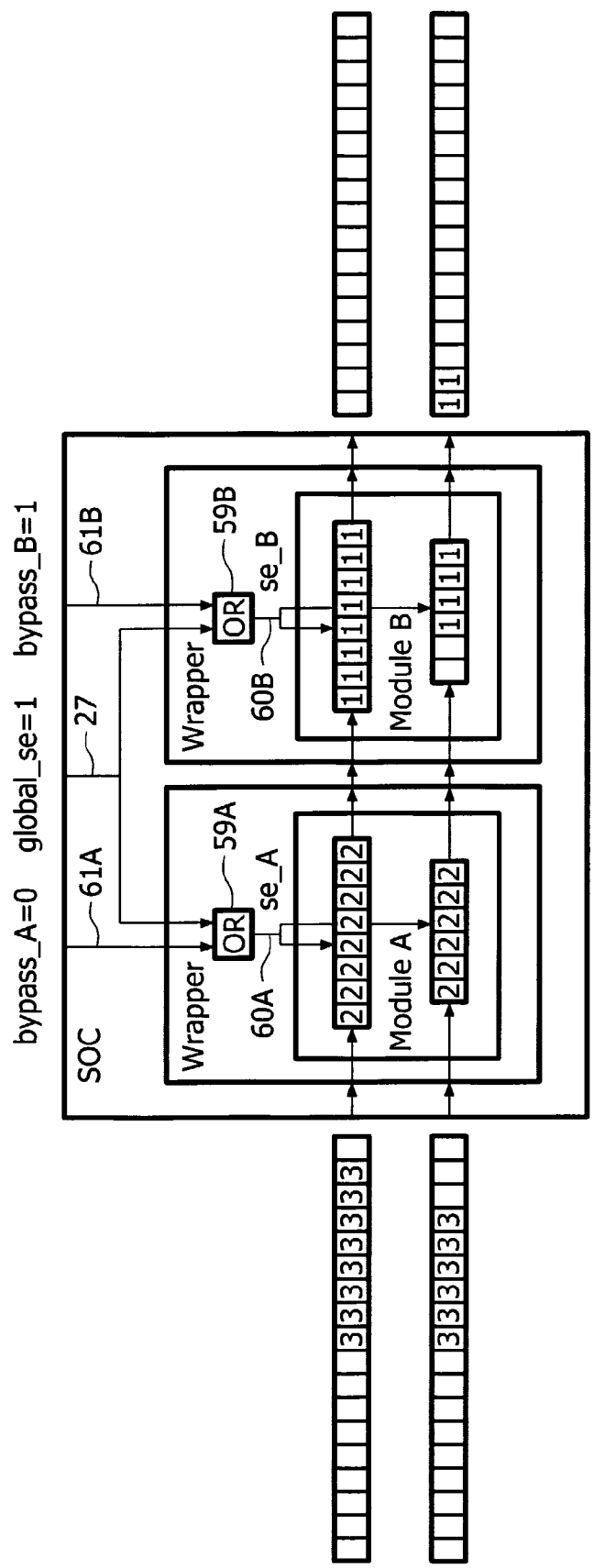

FIG. 6d shows how the second set of test stimulus data is loaded into module A. While this second set of test stimulus data is loaded into module A, it will be noted that the first set of test response data from the previous test is passed into the scan chains of module B, which act as a FIFO buffer. At t=17 the second set of test stimulus data is fully loaded, with the dedicated bypass signal 61A being low, the global scan enable signal 27 high, and the dedicated bypass signal 61B high.

Figure 6E:
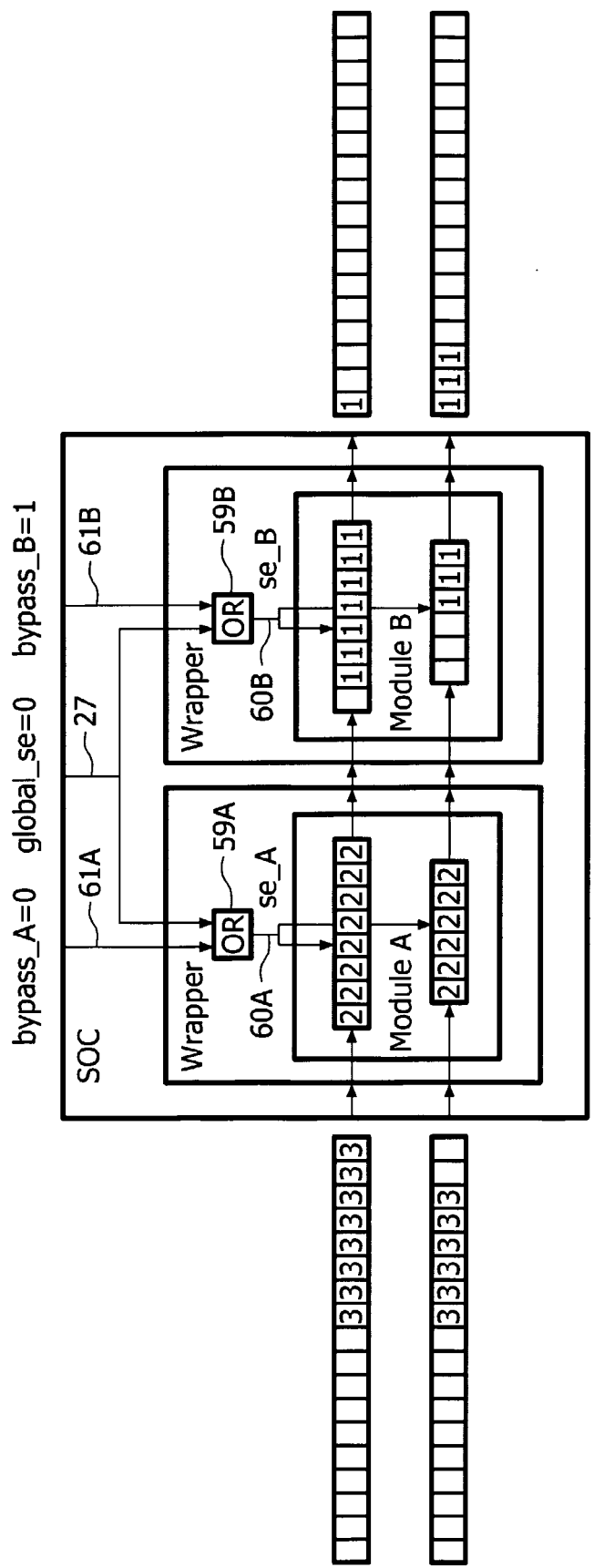

FIG. 6e shows the circuit at t=18, in which the global scan enable signal 27 is taken low. Since the dedicated bypass signal 61A is also low, the global scan enable signal 27 causes the local scan enable signal 60B to go low, thus causing the second set of test stimulus data to be launched and the second set of test response data to be captured.

Meanwhile, since the dedicated bypass signal 61B is high, the global scan enable signal 27 does not pass to the scan chains of module B, thereby keeping the local scan enable signal 60B for module B high. This means that the first set of test response data previously received from module A is not corrupted in module B.

Figure 6F:
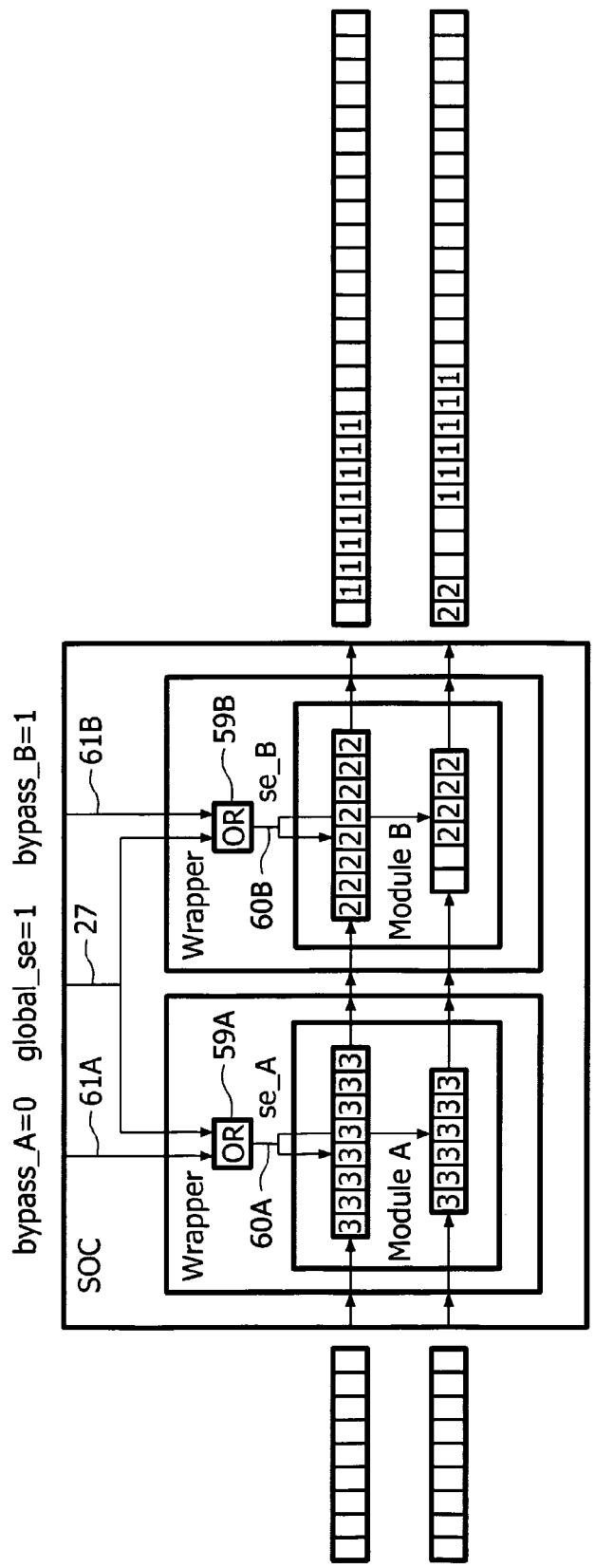
Figure 6G:
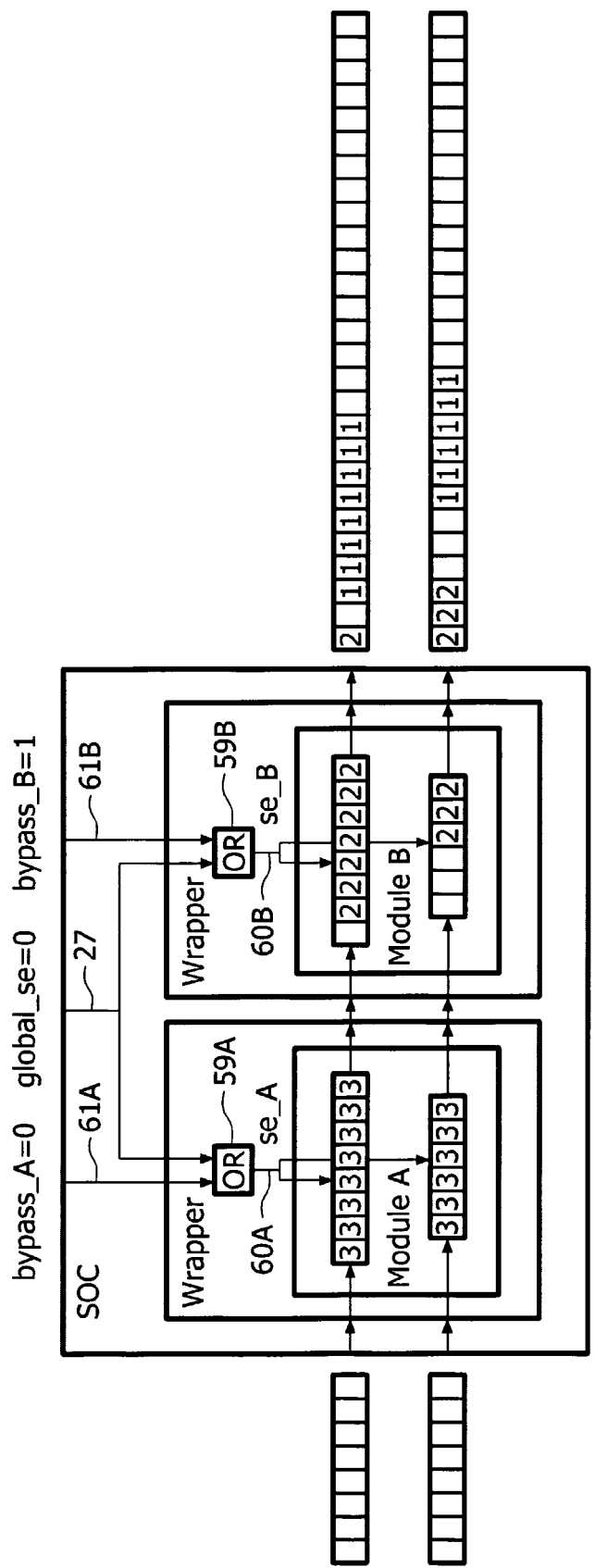

The global scan enable signal 27 is then taken high, and the third set of test stimulus data loaded into the scan chains of module A, as shown in FIG. 6f. As the third set of test stimulus data is loaded, the first and second test response data form the previous tests are shifted out through module B.

FIG. 6f shows the circuit at t=27, in which the global scan enable signal 27 is taken low. Since the dedicated bypass signal 61A is also low, the global scan enable signal 27 causes the local scan enable signal 60A to go low, thus causing the third set of test stimulus data to be launched and the third set of test response data to be captured in module A. Meanwhile, since the dedicated bypass signal 61B is high, the local scan enable signal 60B remains high. This means that the test response data previously received from module A remains unaltered, for shifting out though module B.

Figure 6H:
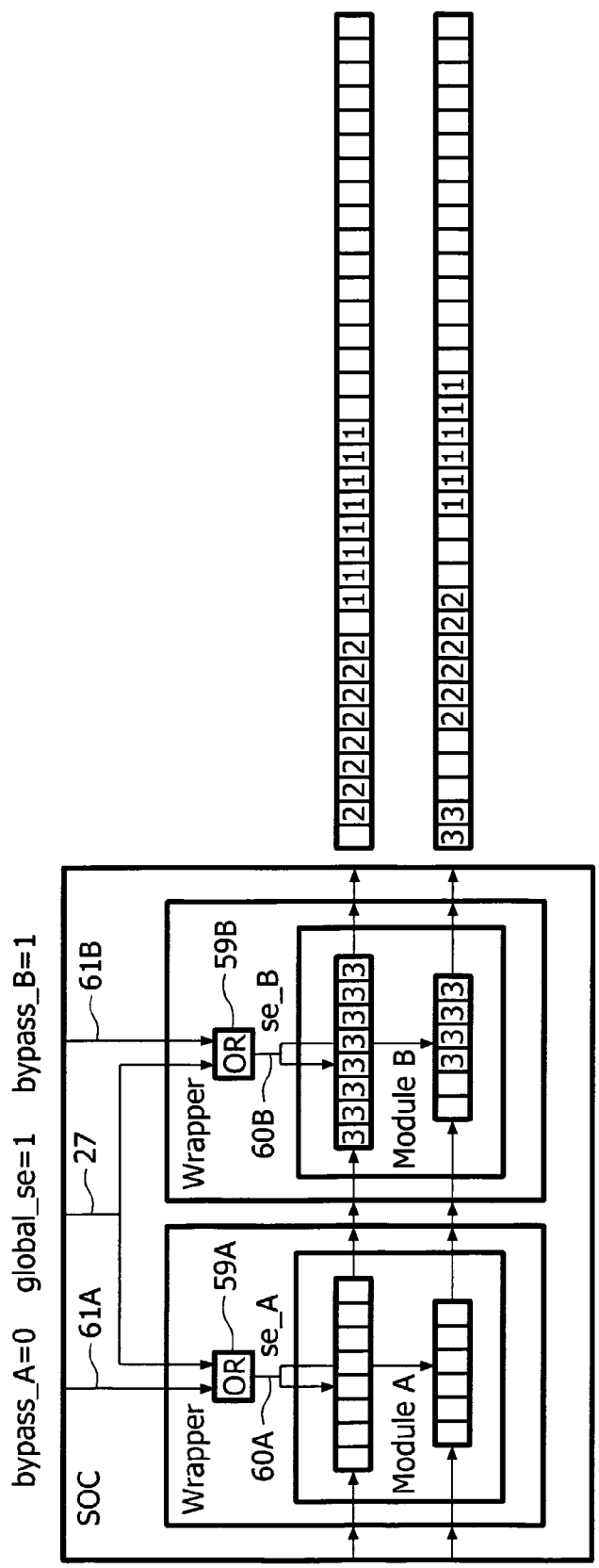

FIG. 6h shows how the third set of test response data is shifted out though module B.

As depicted in FIGS. 6a through 6h, the total test time for applying three test patterns to module A takes 35+8=43 clock cycles. For a realistic scenario, where the number of scan chains, their lengths, and the pattern counts are one hundred times larger, the calculation becomes as follows: (800+1)×300+1600=241900 clock cycles.

In comparison, the number of clock cycles required for each of the conventional methods is as follows:

1. Test Access Through Module—In this case, the test time for module A is calculated as follows: 800+300×(1+1600)=481188 clock cycles. This is an increase of more than 98% compared to what is achieved with the invention. The additional area costs of implementing the invention is limited to one two-input OR gate per module.

2. Test Access Via Bypass—In this case, the test time for module A is calculated as follows: 800+300×(1+801)=241400 clock cycles. This is almost equal to what is achieved with the invention. However, the silicon area costs of this implementation require 200×2=400 bypass flip flops and multiplexers.

Therefore, it can be seen that the invention provides a test access architecture that has the advantages of operating at substantially the same speed as the bypass mode, but without having the additional overhead in terms of bypass hardware.

As mentioned earlier, although the preferred embodiments have been described using an OR gate as the control circuit, it will be appreciated that other forms of control circuit could be used, depending on the status of the control signals.

Furthermore, the OR gate may be located within a test wrapper, within a module itself, or further away in the SOC.

In addition, although the preferred embodiments have been described using two modules, the invention applies to any number of modules connected to the TAM. Also, although the TAM described in the example is two bits wide, the invention is equally applicable to a TAM of any width.

It is also noted that, although the example provided above has been described using one clock cycle for the test launch/capture procedure, it will be appreciated that the launch and capture process may comprise a plurality of clock cycles for certain tests.

It will be appreciated by a person skilled in the art that other variations and modifications are possible, without departing from the scope of the invention as defined by the appended claims.

The invention claimed is:

1. A test access architecture for testing a cascade of modules embedded in an electronic circuit, each of the modules being isolated from surrounding circuitry by an associated test wrapper that provides switching functionality between functional access and test access to the module associated with the test wrapper, the test access architecture comprising:
a test access mechanism arranged to transport test stimulus data to a module of the cascade that is in a test mode and to transport test response data from the module in the test mode, the test access mechanism configured to transport the test stimulus data and the test response data via a single data path that passes through each module of the cascade;
circuitry configured to provide a global enable signal to each of the modules, the global enable signal provided for placing the modules in the test mode; and a plurality of control circuits, each of the control circuits associated with one of the modules and each of the control circuits arranged to control whether the global enable signal is passed to the module associated with the control circuit.

2. The test access architecture as recited in claim 1, wherein each module of the cascade is configured to operate in one of two modes, each of the modes using the single data path, the first mode being a transport mode in which the test stimulus and response data is passed through the module unmodified and the second mode being the test mode in which the module generates the test response data from the test stimulus data, and wherein each of the control circuits is controlled by a dedicated bypass signal for the module associated with the control circuit.

3. The test access architecture as recited in claim 2, wherein each of the control circuits is connected to receive the global enable signal and the dedicated bypass signal, and each of the control circuits is arranged to provide a local enable signal to the module associated with the control circuit based on the respective states of the global enable signal and the dedicated bypass signal.

4. The test access architecture as recited in claim 3, wherein each of the control circuits is arranged to pass the global enable signal if the module associated with the control circuit is being tested, and to block the global enable signal if the module associated with the control circuit is not being tested.

5. The test access architecture as recited in claim 1, wherein the test access mechanism is configured to simultaneously transport multiple sets of test stimulus data to the module being test via the single data path, and wherein each of the control circuits is an OR gate.

6. The test architecture as recited in claim 1, wherein each of the control circuits is an AND gate.

7. The test architecture as recited in claim 1, wherein the test access mechanism is configured to place the modules of the cascade that are not being tested in a transport mode of operation in which the modules not being tested do not modify the test stimulus data being transported to the module in the test mode and the modules not being tested do not modify the test response data being transferred from the module in the test mode, and wherein the electronic circuit is an integrated circuit.

8. The test architecture as recited in claim 7, wherein each of the control circuits is located within the test wrapper of the module associated with the control circuit.

9. The test architecture as recited in claim 7, wherein each of the control circuits is located in a test control block of a system on chip.

10. The test architecture as recited in claim 1, wherein the test access mechanism is arranged to load the test stimulus data into the module in the test mode from another one of the modules in a pipelined manner and to unload the test response data from the module in the test mode into a further one of the modules in a pipelined manner.

11. The test access architecture as recited in claim 1, wherein the global enable signal is global to the test access mechanism (TAM), and wherein the plurality of modules are connected to the TAM, the TAM configured to place the other modules in a transport mode of operation while the module is in the test mode.

12. The test access architecture as recited in claim 1, wherein the global enable signal is global to more than one test access mechanism (TAM) on the electronic circuit.

13. A method of testing a module in an electronic circuit, the module being one of a cascade of modules embedded in the electronic circuit, the cascade of modules being connected in series to a test access mechanism, each of the modules being isolated from surrounding circuitry by an associated test wrapper that provides switching functionality between functional access and test access to the module associated with the test wrapper, the test access mechanism arranged to transport test stimulus data to the module being tested, and to transport test response data from the module being tested, the test access mechanism configured to transport the test stimulus data and test response data via a single data path that passes through each module of the cascade, the method comprising the steps of:

loading a first set of test stimulus data into the module being tested;

testing the module in response to a global enable signal being activated;

unloading test response data captured from the module being tested; and during the testing step, placing the other modules connected to the test access mechanism in a transport mode of operation, wherein, in the transport mode of operation, the other modules do not corrupt a second set of test stimulus data being loaded into the module being tested, and the other modules do not corrupt previous test response data being unloaded from the module being tested, wherein each of the modules in the transport mode of operation use the single data path and the module being tested uses the single data path.

14. The method as recited in claim 13, further comprising the step of providing a plurality of control circuits, each of the control circuits located between the global enable signal and an associated one of the modules, wherein each of the control circuits is arranged to control whether the global enable signal is passed to the module associated with the control circuit.

15. The method as recited in claim 14, wherein each of the control circuits is controlled by a dedicated bypass signal.

16. The method as recited in claim 15, wherein each of the control circuits is connected to receive the global enable signal and the dedicated bypass signal, and each of the control circuits is arranged to provide a local enable signal to the module associated with the control circuit based on the respective states of the global enable signal and the dedicated bypass signal.

17. The method as recited in claim 16, wherein each of the control circuits is arranged to pass the global enable signal if the module associated with the control circuit is being tested, and to block the global enable signal if the module associated with the control circuit is to be placed in the transport mode.

18. The method as recited in claim 14, further comprising the step of providing an OR logic function as each of the control circuits.

19. The method as recited in claim 14, further comprising the step of providing an AND logic function as each of the control circuits.

20. The method as recited in claim 14, further comprising the step of providing each of the control circuits within the test wrapper of the module associated with the control circuit.

21. The method as recited in claim 14, further comprising the step of providing each of the control circuits in a test control block of a system on chip.

22. The method as recited in claim 15, further comprising the step of providing each of the control circuits within the module associated with the control circuit.

23. The method as recited in claim 13, wherein the test pattern data is processed in a pipelined manner in which ones of the modules located prior to the module being tested contain further sets of test stimulus data from a series of test stimulus data, and ones of the modules located after the module being tested contain test response data from previous tests.

24. The method as recited in claim 13, wherein the first set of test stimulus data is loaded into the module being tested from another one of the modules and the test response data captured from the module being tested is unloaded into a further one of the modules, and wherein the global enable signal is arranged to be global to the test access mechanism.

25. The method as recited in claim 13, wherein the global enable signal is arranged to be global to more than one test access mechanism (TAM) on the electronic circuit.

* * * * *